(12) United States Patent
Arghavani et al.

(10) Patent No.: US 7,049,200 B2
(45) Date of Patent: May 23, 2006

(54) METHOD FOR FORMING A LOW THERMAL BUDGET SPACER

(75) Inventors: Reza Arghavani, Scotts Valley, CA (US); Ken MacWilliams, Portland, OR (US); Hichem M'Saad, Santa Clara, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/854,013

(22) Filed: May 25, 2004

(65) Prior Publication Data

US 2005/0266622 A1 Dec. 1, 2005

(51) Int. Cl.
*H01L 21/336* (2006.01)

(52) U.S. Cl. .................. 438/303; 438/786; 438/790

(58) Field of Classification Search ........... 427/253.29, 427/255.37, 255.393, 255.394; 438/199, 438/299, 301, 303, 306.786, 790, 791, 794
See application file for complete search history.

(56) References Cited

U.S. PATENT DOCUMENTS

| | | | |
|---|---|---|---|
| 5,976,991 A * | 11/1999 | Laxman et al. | 438/786 |
| 6,121,096 A | 9/2000 | Hopper | |
| 6,153,261 A * | 11/2000 | Xia et al. | 427/255.393 |
| 6,297,115 B1 | 10/2001 | Yu | |
| 6,368,928 B1 | 4/2002 | Wang et al. | |
| 6,509,241 B1 | 1/2003 | Park et al. | |
| 6,630,386 B1 | 10/2003 | Yu | |
| 6,677,201 B1 | 1/2004 | Bu et al. | |
| 2002/0137293 A1 | 9/2002 | Chen et al. | |
| 2003/0020111 A1* | 1/2003 | Bevan | 257/303 |
| 2003/0032295 A1 | 2/2003 | Park et al. | |
| 2003/0129804 A1* | 7/2003 | Mehrotra et al. | 438/303 |
| 2003/0211728 A1 | 11/2003 | Mandal | |
| 2004/0052969 A1 | 3/2004 | Lee et al. | |
| 2004/0063264 A1 | 4/2004 | Zheng et al. | |
| 2004/0132257 A1* | 7/2004 | Furuhashi et al. | 438/299 |

* cited by examiner

*Primary Examiner*—Asok Kumar Sarkar
(74) *Attorney, Agent, or Firm*—Townsend & Townsend & Crew (57) ABSTRACT

A method of forming a sidewall spacer on a gate electrode of a metal oxide semiconductor device that includes striking a first plasma to form an oxide layer on a side of the gate electrode, where the first plasma is generated from a oxide gas that includes $O_3$ and bis-(tertiarybutylamine)silane, and striking a second plasma to form a carbon-doped nitride layer on the oxide layer, where the second plasma may be generated from a nitride gas that includes $NH_3$ and the bis-(tertiarybutylamine)silane. The first and second plasmas may be formed using plasma CVD and the bis-(tertiarybutylamine)silane flows uninterrupted between the striking of the first plasma and the striking of the second plasma.

20 Claims, 5 Drawing Sheets

METHOD FOR FORMING A LOW THERMAL BUDGET SPACER

BACKGROUND OF THE INVENTION

Many modern semiconductor devices are composed of MOS (Metal-Oxide-Semiconductor) transistors and capacitors, in which the MOS transistors generally include a source, drain, and gate. The gate is sometimes called a gate stack because it may include a plurality of components components, such as a gate electrode and an underlying gate dielectric. Sidewall spacers (also called spacers, or spacer layers) may be adjacent to the gate structure and usually include an oxide layer and a nitride layer component.

Spacers serve a number of functions in the formation of semiconductor devices. One function of spacers is to assist in the alignment of silicide layers above the source-drain regions and the gate electrode. Silicide layers are highly conductive compared to the underlying source-drain regions and gate electrode, and facilitate the transfer of electric signals to and from the transistor. The silicide layers are formed by depositing a metal layer (e.g., titanium, cobalt, nickel, etc.) where the metal is reactive with the underlying materials in the source-drain regions and gate electrode, but not as reactive (or not reactive at all) with the materials in the spacers. The unreacted metal is selectively etched to formed gaps between the reacted silicide layers, thus preventing the layers from forming shorts between one another.

Another function of spacers may be to prevent the migration of dopants from the source and drain regions (and halo sections) upward into overlying layers (e.g., oxide layers such as the gate oxide layer, etc.). When dopants (e.g., boron) migrate upward it sets up concentration gradients in the underlying source or drain region, which can cause parasitic junctions that increase power consumption by the transistor. Spacers act as a barrier to this type of dopant migration. For example, spacers that include carbon-doped materials are effective in blocking boron from migrating out of underlying source or drain regions.

Conventional spacers are made up of $SiO_2/Si_3N_4$ layers manufactured by low pressure chemical vapor deposition processes (LPCVD). In such LPCVD methods, a nitrogen-contained gas is reacted with a silicon-containing gas to deposit silicon-nitride on the substrate. Typically, the silicon-containing gas is $SiH_2Cl_2$, $Si_2H_6$ or $SiH_4$; and the nitrogen-contained gas comes from ammonia ($NH_3$). LPCVD processes typically occur at operating temperature of about 600° C. to about 800° C.

In semiconductor device manufacturing, the conductivity of a semiconductor material may be controlled by doping the semiconductor material with a dopant. The dopant source concentration and distribution affect the performance of the semiconductor devices. At high temperatures, thermal diffusion can cause the dopant region to expand or shift, thereby reducing the concentration of dopant in a dopant region. Extensive thermal diffusion can also cause the dopant region to close or overlap each other causing short channel and punch-through effects. The hydrogen produced when forming a silicon nitride layer by LPCVD may easily be adsorbed by the silicon nitride layer to act like a dopant material. At high temperatures, the hydrogen diffuses into the gate oxide and channel causing a threshold voltage shift of the MOS transistor.

Thus, it is desirable to be able to form spacers that reduce hydrogen atom diffusion into the gate oxide and channel and to reduce adverse electrical effects arising from impurity diffusion, especially for manufacturing highly integrated sub-micron semiconductor processes. However, with conventional methods of forming the $SiO_2/Si_3N_4$ layers (i.e., LPCVD) it is difficult to control the adverse electrical effects that arise from impurity diffusion. It is also desirable to have a method of manufacturing the $SiO_2/Si_3N_4$ layers having carbon-doping to slow the diffusion of dopants such as boron. These and other problems are addressed by embodiments of the present invention.

BRIEF SUMMARY OF THE INVENTION

An embodiment of the invention includes a method of forming a sidewall spacer on a gate electrode of a metal oxide semiconductor device, including the step of striking a first plasma to form an oxide layer on a side of the gate electrode, where the first plasma is generated from a oxide gas comprising $O_3$ and bis-(tertiarybutylamine)silane. The method further includes striking a second plasma to form a carbon-doped nitride layer on the oxide layer, where the second plasma is generated from a nitride gas comprising $NH_3$ and the bis-(tertiarybutylamine)silane. The first and second plasmas are formed using plasma CVD and the bis-(tertiarybutylamine)silane flows uninterrupted between the striking of the first plasma and the striking of the second plasma.

Additional embodiments of the invention include a method of forming a metal-oxide semiconductor device, the method include the steps of providing a semiconductor substrate, and forming a gate oxide and a gate electrode over the substrate. The method further including forming a halo section in the substrate, and forming a first sidewall spacer along a first side of the gate electrode and over the halo section, and a second sidewall spacer along a second side of the gate electrode opposite the first side. The first and the second sidewall spacers include an oxide layer contacting the gate electrode and a carbon-doped nitride layer contacting the oxide layer, where both the oxide layer and the nitride layer are formed by way of plasma CVD using a silicon source comprising bis-(tertiarybutylamine) silane.

Other embodiments of the invention include a method of forming a field effect transistor in a low thermal budget process, the method including the steps of forming a gate electrode over a semiconductor substrate and forming a halo section that includes a boron dopant in the substrate. The method also includes forming a first sidewall spacer along a first side of the gate electrode and over the halo section, and a second sidewall spacer along a second side of the gate electrode, opposite the first side. The first and the second sidewall spacers include an oxide layer contacting the gate electrode and a carbon-doped nitride layer contacting the oxide layer. Both the oxide layer and the nitride layer are formed by way of plasma CVD operating at a temperature from about 250° C. to about 400° C. using a silicon source that includes bis-(tertiarybutylamine)silane.

Additional features are set forth in part in the description that follows, and in part will become apparent to those skilled in the art upon examination of the following specification or may be learned by the practice of the invention. The features and advantages of the invention may be realized and attained by means of the instrumentalities, combinations, and methods particularly pointed out in the appended claims.

DETAILED DESCRIPTION OF THE INVENTION

As noted above, the shrinking sizes of transistors require precise positioning of the transistor elements that define the channel region. These elements include the source and drain regions formed in the substrate. They also include counter-doped regions (e.g., halo sections) that may be formed at the ends of the source and drain regions and may define the length of the channel region.

As the channel regions of transistors get shorter the migration of dopants in the source and drain regions and halo sections becomes more problematic. The probability increases that dopants will migrate from the source region to the drain region (or from opposite halo sections), weakening the ability of the transistor control current flow through the channel region. In some circumstances, dopant migration may be severe enough to cause a disabling short circuit in the transistor (e.g., a short between the gate electrode and source or drain region).

One aspect of controlling dopant migration is to keep the transistor fabrication steps within an adequate thermal budget. Generally, dopant migration increases with increasing temperature so process steps that raise the temperature of the dopant containing regions (e.g., source and drain regions, halo sections, etc.) should not exceed a temperature that will cause dopants to migrate uncontrollably across the channel region. One process step whose thermal budget deserves consideration because of dopant migration is the forming of spacers next to the sidewall of the gate electrode.

Spacers are in close proximity (sometimes even direct contact) with source and drain regions and halo sections. This means that the elevated temperatures used during the formation of the spacers quickly raise the temperature of the nearby source-drain and halo sections, increasing dopant migration. Embodiments of the present invention address this issue by using a low thermal budget plasma chemical vapor deposition (plasma CVD) process such as those described in U.S. Pat. No. 5,362,526, entitled "Plasma Enhanced CVD Process Using TEOS for Depositing Silicon Oxide", the contents of which are herein incorporated by reference.

Plasma CVD techniques promote excitation and/or dis-association of the reactant gases by application of radio frequency (RF) energy to a reaction zone near the substrate surface, thereby creating a plasma of highly reactive species. The high reactivity of the released species reduces the energy required for a chemical reaction to take place, and thus lowers the temperatures required for such processes. Plasma CVD temperatures (e.g., about 250° C. to about 400° C.) are lower than conventional spacer formation processes (e.g., LPCVD), which operates in a temperature range from about 600° C. to about 800° C. during spacer formation.

Embodiments of the invention use a carbon containing silicon source. The carbon containing silicon source may also include nitrogen, such as, for example, an amino silane compound. Particular examples of amino silane compounds that can be used with embodiments of the present invention include bis-(tertiarybutylamine)silane ($H_2Si[NHC(CH_3)_3]_2$), also referred to as BTBAS. Unlike silane ($SiH_4$), BTBAS can provide carbon doping in the silicon source without using an additional carbon source or performing a post-deposition doping step. In embodiments of the invention, BTBAS may flow continuously as the oxygen source gas (e.g., $O_3$) is switched to the nitrogen source gas (e.g., $NH_3$) between the formation of a spacer oxide layer and spacer nitride layer. This can reduce the time and costs to form the spacers on the sides of the gate electrode and increase to overall efficiency of the semiconductor fabrication process.

Exemplary Transistor

Figure 1A:
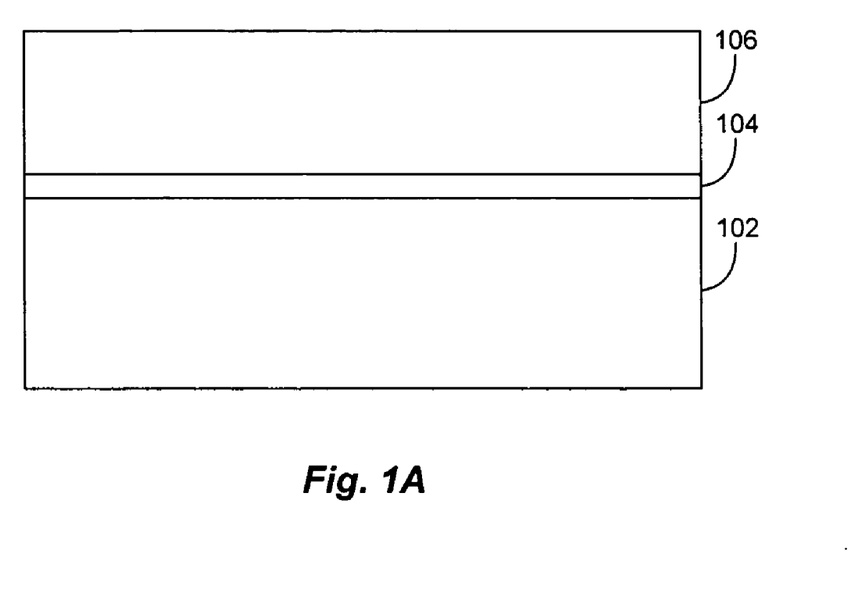
FIGS. 1A–D show a cross-sectional views of stages of a process of forming sidewall spacers according to an embodiment of the invention.

Referring now to FIG. 1A, a semiconductor substrate 102 (e.g., a silicon wafer) is shown with gate oxide layer 104 on a top surface and a polysilicon gate layer 106 over oxide layer 104. Gate oxide layer 102 may be a thermally grown $SiO_2$ layer with a thickness of about 30 Å or less. After the gate oxide layer 102 is formed, the polysilicon gate layer 106 may be deposited using conventional techniques (e.g., low pressure CVD, etc.) to a thickness of about 100 Å or more (e.g., from about 100 Å to about 500 Å) to provide the structure illustrated in FIG. 1A. Additional layers (not shown) may also be present, such as an additional oxide layer above polysilicon gate layer 106 to form an oxide/polysilicon stack.

Figure 1B:
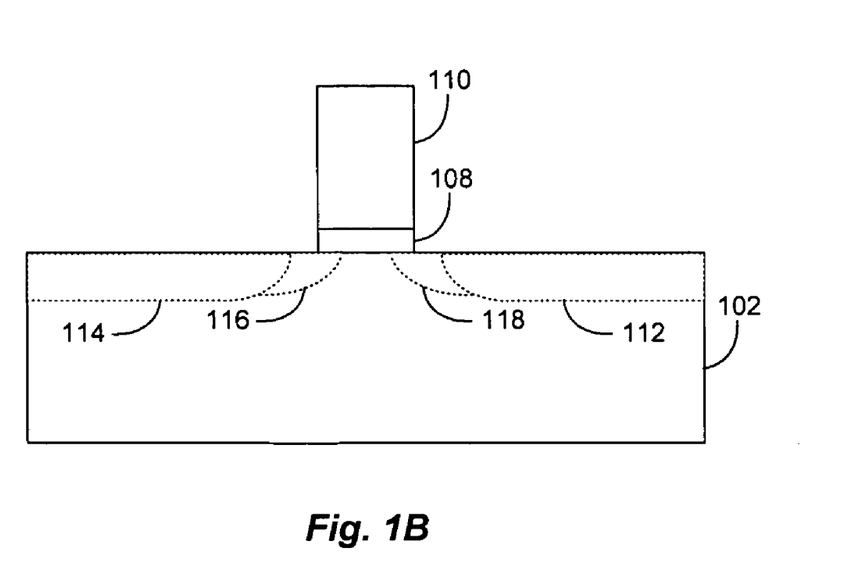

Referring now to FIG. 1B, the stack shown in FIG. 1A is pattern etched to form gate oxide 108 and gate electrode 110. The gate oxide 108 may have a thickness (i.e., height) of about 10 Å to about 50 Å and the gate electrode may have a thickness of about 500 Å to about 2500 Å.

The source and drain regions 112, 114 and halo sections 116 and 118 may also be formed in substrate 102. Source and drain regions 112, 114 may be formed using conventional ion implantation. For example, ions (e.g., silicon ions, germanium ions, etc.) may be accelerated at about 5 keV to about 130 keV into the single crystal substrate 102 to form amorphous silicon implant regions. Accompanying the bombardment ions are dopants that are typically delivered in a dose of about $1015$ ions/cm$^2$ (e.g., about $1\times10^3$ to about $1\times10^5$ ions/cm$^2$). The dopants may be any dopant appropriate for the semiconductor device being manufactured, such as phosphorous, arsenic, etc. for an NMOS device, and boron, indium, etc. for a PMOS device.

In some embodiments, the halo sections 116 and 118 may also be formed via ion implantation. For example, dopant ions in concentrations of about $1\times10^2$ to about $1\times10^4$ ions/cm$^2$ may be accelerated into substrate 102 with implant energy of about 25 keV to about 60 keV to form halo sections 116 and 118. In some embodiments, after ion implantation the device may undergo one or more thermal anneals to position the dopants. For example, the device may be annealed at a temperature of about 900° C. to about 1100° C. In another example, the device may undergo rapid thermal annealing (RTA).

Figure 1C:
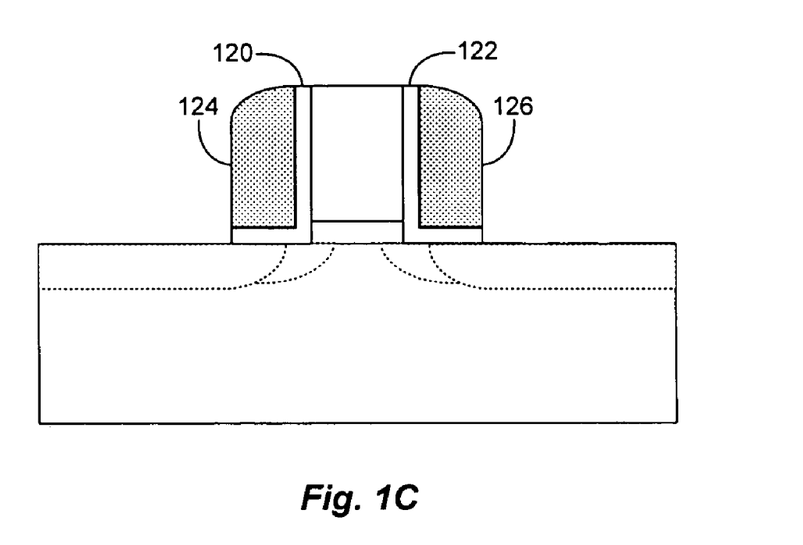

FIG. 1C shows a pair of sidewall spacers formed on the sides of gate oxide 108 and gate electrode 110. The sidewall spacers include oxide layers 120 and 122 (which may be in physical contact with the gate electrode 110 and/or gate oxide 108) and nitride layers 124 and 126 formed on the oxide layers 120 and 122, respectively.

The spacers may be formed using a plasma CVD process according to embodiments of the invention. The process may include flowing an oxide gas that includes BTBAS and an oxygen source into a process chamber and striking a plasma with plasma CVD to deposit oxide layers 120 and 122. The oxygen source may be pure ozone ($O_3$) or a mixture of ozone in oxygen ($O_2$) (e.g., a mixture of 12.5 wt % of $O_3$ in $O_2$). Then, with the BTBAS component still flowing, the oxygen source is switched to a nitrogen source (e.g., $NH_3$) to generate a nitride gas and a second plasma is used to form nitride layers 124 and 126.

Figure 1D:
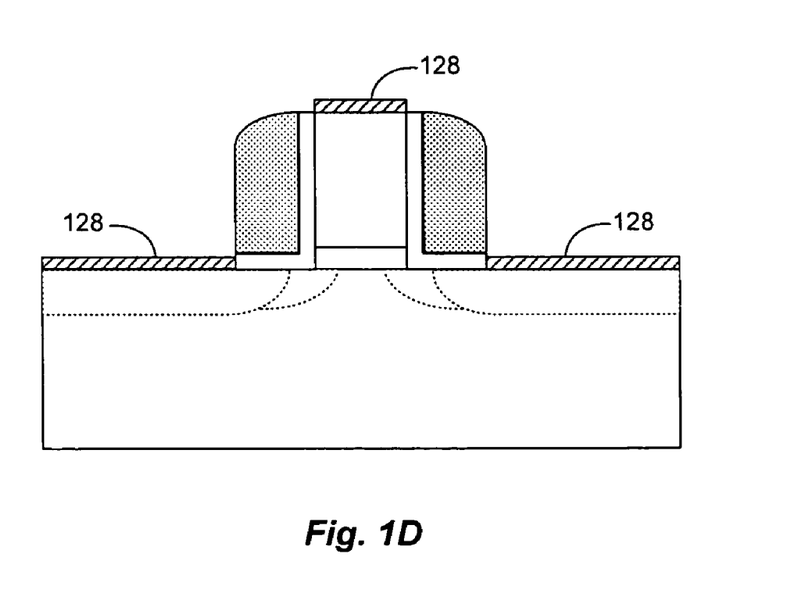

Referring now to FIG. 1D, following the formation of the spacers a silicidation step may occur to form silicide layers 128. The silicide layers 128 are conductive and may be alloys of metal (e.g. Ti, Co, Ni, etc.) and silicon that was formed from the reaction of a metal layer (not shown) with the underlying source-drain regions and gate electrode 114, 112 and 110. In post-silicidation steps, electrical contacts (not shown) may be formed on silicide layers 118 to conduct electrical signals to and from the transistor.

Exemplary Method

Figure 2:
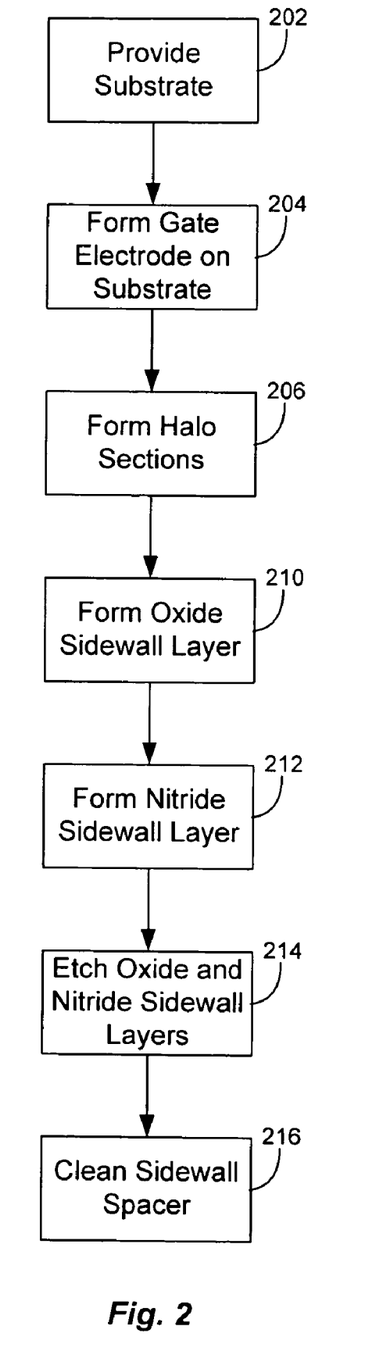
FIG. 2 shows a flowchart illustrating a process of forming a sidewall spacer according to an embodiment of the invention.

Referring now to FIG. 2, a flowchart illustrating the steps of a method according to embodiments of the present invention is shown. The method starts with providing a substrate (e.g., a silicon wafer) in step 202 and then forming a gate electrode on the substrate in step 204. Forming the gate electrode may include depositing one or more layer on the substrate (e.g., an oxide layer, a polysilicon layer, etc.) followed by patterned etching to form the gate electrode.

Halo sections are formed in the substrate in step 206 following the formation of the gate electrode. The halo sections may be formed by, for example, conventional ion implantation, which may optionally be followed by one or more annealing steps. In some embodiments of the method (not shown), the halo sections are formed in the substrate prior to the formation of the gate electrode.

An oxide sidewall layer may be formed 210 on a side of the gate electrode and a portion of the substrate adjacent to the electrode. As noted above, the oxide sidewall layer may be formed by striking a plasma CVD plasma that is generated from an oxide gas comprising ozone ($O_3$) and BTBAS.

Following the formation of the oxide sidewall layer, a nitride sidewall layer may be formed 212 using the same stream of BTBAS while switching from ozone to $NH_3$. The switch is accompanied by the formation of a second plasma that deposits the nitride sidewall layer on the oxide sidewall layer. The formation of both the oxide and nitride sidewall layers may include flowing BTBAS at about 200 to about 600 milligrams per minute (mgm), while ozone flows at a rate of about 5 to about 20 standard cubic centimeters per minute (sccm) during the formation of the oxide sidewall layer, and $NH_3$ flows at a rate of about 200 to about 3000 sccm during the formation of the nitride sidewall layer. In addition, helium, acting as a carrier gas, may also flow at about 1000 sccm to about 3000 sccm.

In both the formation of the oxide and nitride sidewall layers, the pressure of the gases used in the plasma CVD chamber may have a range of about 2.5 torr to about 6 torr and the RF generators used to strike and maintain the plasma may use a high-frequency power range of about 100 to about 300 Watts, and a low-frequency power of about 0 Watts to about 200 Watts. The deposition temperature may range from about 250° C. to about 400° C. The substrate is spaced from about 250 mils to about 480 mils from the top electrode (e.g., showerhead).

The sidewall spacers formed may be substantially conformal to the substrate and gate electrode. A substantially conformal sidewall spacer is formed in such a manner that the thickness of the spacer is similar on both the vertical and horizontal surfaces to the underlying patterned layer. In some embodiments, an etch step 214 may occur to further shape the spacer. For example, the spacer may be etched to have closer conformity with the L-shaped corner formed by the substrate and gate electrode. Following the etching of the nitride sidewall layer (and possibly the oxide sidewall layer) the sidewall spacer may be cleaned 216 in preparation for further fabrication processes (e.g., silicidation).

Exemplary Substrate Processing Chamber

Figure 3A:
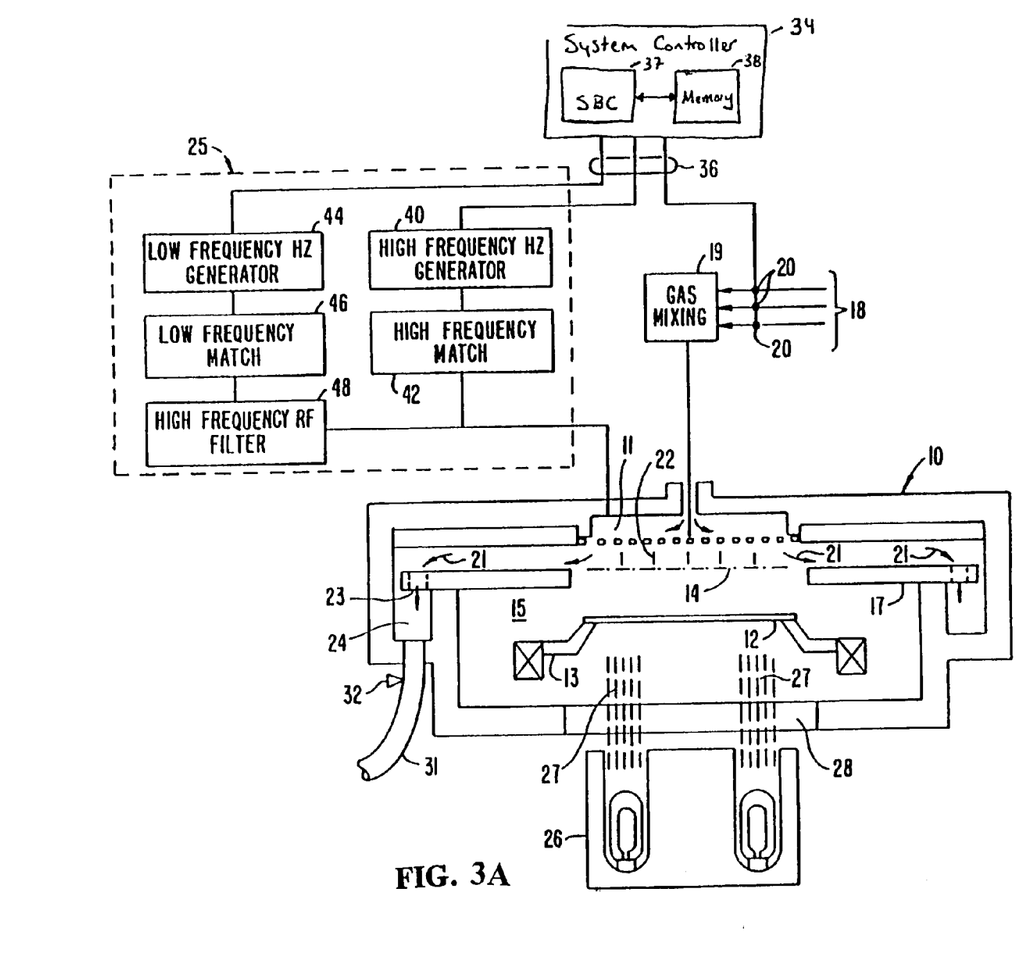
FIG. 3A shows a vertical, cross-sectional view of an embodiment of an apparatus for plasma CVD in which the methods of the present invention may be carried out.

Plasma CVD processes that may be used with embodiments of the invention include capacitively coupled plasma enhanced chemical vapor deposition (PECVD). FIG. 3A illustrates an embodiment of a parallel-plate (PECVD) system 10 that may be used in conjunction with embodiments of the methods of the present invention. System 10 includes a vacuum chamber 15 in which one or more layers may be deposited on a substrate (not shown). System 10 contains a gas distribution manifold 11 for dispersing process gases through perforated holes in manifold 11 to a substrate (e.g., a 200 mm wafer, 300 mm wafer, etc.) positioned on susceptor 12. Susceptor 12 is thermally responsive and is mounted on supports 13 such that the susceptor 12 (and the substrate) can be controllably moved between a lower loading/off-loading position and an upper processing position 14, which is in proximity to manifold 11. A center board (not shown) includes sensors for providing information on the position of the substrate.

When susceptor 12 and substrate are in processing position 14, they are surrounded by baffle plate 17 having a plurality of spaced holes 23 which exhaust into an annular vacuum manifold 24. Deposition and carrier gases are supplied through supply lines 18 into a mixing system 19 where they are combined and then sent to manifold 11. Supply lines 18 for each of the process gases may include (i) safety shut-off valves (not shown) that can be used to automatically or manually shut-off the flow of process gas into the chamber, and (ii) mass flow controllers 20 that measure the flow of gas or liquid through the supply lines. When toxic gases are used in the process, the several safety shut-off valves are positioned on each gas supply line in conventional configurations.

The rate at which deposition and carrier gases are supplied to gas mixing system 19 is controlled by liquid or gas mass flow controllers 20 and/or by valves. During processing, gas supplied to manifold 11 is vented toward and uniformly distributed radially across the surface of the wafer in a laminar flow as indicated by arrows 21 and 22. An exhaust system then exhausts the gas via ports 23 into the circular vacuum manifold 24 and out an exhaust line 31 by a vacuum pump system (not shown). The rate at which gases are released through exhaust line 31 is controlled by a throttle valve 32.

When performing a plasma enhanced process in system 10, a controlled plasma may be formed adjacent to the substrate by RF energy applied to manifold 11 from RF power supply 25. Manifold 11 may also act as an RF electrode, while susceptor 12 is grounded. RF power supply 25 may supply single or mixed frequency RF power (or other desired variations) to manifold 11 to enhance the decomposition of reactive species introduced into chamber 15. The mixed frequency RF power is generated by a high frequency RF generator 40 (RF1) and corresponding match circuit 42 and a low frequency RF generator 44 (RF2) and corresponding match circuit 46. A high frequency filter 48 prevents voltage generated by high frequency generator 40 from damaging the low frequency generator.

Heat is distributed by an external lamp module 26. External lamp heater module 26 provides a collimated annular pattern of light 27 through a quartz window 28 onto an annular outer peripheral portion of susceptor 12. Such heat distribution compensates for the natural heat loss pattern of susceptor 12 and provides rapid thermal and uniform susceptor and substrate heating for effecting deposition.

The chamber lining, gas distribution manifold faceplate, supports 13, and other system hardware may be made out of materials such as aluminum or anodized aluminum. An example of such an apparatus is described in U.S. Pat. No. 5,000,113 entitled "Thermal CVD/PECVD Reactor and Use for Thermal Chemical Vapor Deposition of Silicon Dioxide and In situ Multi-step Planarized Process," issued to Wang et al, an assigned to Applied Materials, Inc., the assignee of the present invention, the entire contents of which is herein incorporated by reference.

A motor (not shown) raises and lower susceptor 12 between a processing position 14 and a lower, substrate-loading position. Motors and optical sensors are used to move and determine the position of movable mechanical assemblies such as throttle valve 32 and susceptor 12. The heater, motors, valves and flow controllers 20 connected to supply lines 18, gas delivery system, throttle valve 32, RF power supply 25, and lamp magnet drivers are all controlled by a system controller 34 over control lines 36, some of which are shown in FIG. 3A.

System controller 34 controls activities of the apparatus. The system controller executes system control software, which is a computer program stored in a computer-readable medium such as a memory 38. Preferably, memory 38 may be a hard disk drive, but memory 38 may also be other kinds of memory. The computer program includes sets of instructions that dictate, for example, the timing, mixture of gases, chamber pressure, chamber temperature, RF power levels, susceptor position, and other parameters of a process. Other computer programs (e.g., one stored on another memory device such as a floppy disk or other program storage media) may also be used to operate processor 34.

The system controller may include a hard disk drive (memory 38), floppy disk drive and card rack, among other elements. The card rack contains a single board computer (SBC) processor 37, analog and digital input/output boards, interface boards and stepper motor controller boards. Various parts of system 10 may conform to the Versa Modular European (VME) standard that defies board, card cage, and connector dimensions and types. The VME standard also defines the bus structure having a 16-bit data bus and 24-bit address bus.

Figure 3B:
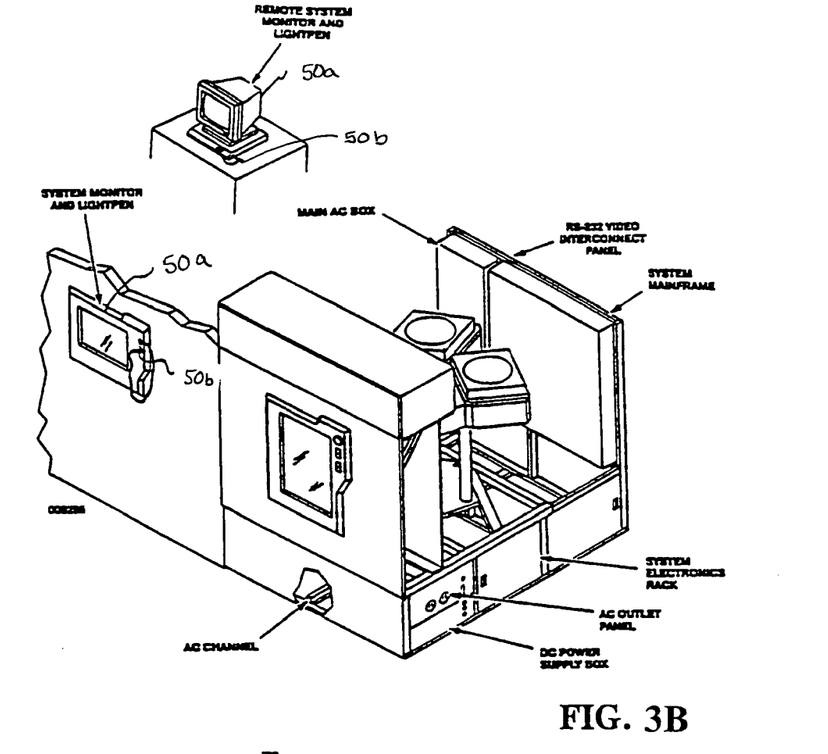
FIG. 3B shows a diagram of an embodiment of a system monitor an apparatus for plasma CVD that may be used with the methods of the present invention.

Referring now to FIG. 3B, a substrate processing apparatus including PECVD system 10 is shown. The apparatus also shows the interface between a user and processor via a monitor 50a and light pen 50b. In other embodiments, two monitors may be used, where a first monitor is located in a clean room (not shown) for apparatus operators, and a second monitor is located outside the clean room for viewing by service technicians. Both monitors may display the information.

Light pen 50b detects light emitted by monitor 50a with a light sensor in the tip of the pen. To select a particular screen or function, the operator touches a designated area of the display screen and pushes the button on pen 50b. The touched area changes its highlighted color, or a new menu or screen is displayed, confirming communication between the light pen and the display screen. Other devices (e.g., keyboard, mouse, etc.) may be used instead of (or in addition to) light pen 50b to allow the user to communicate with processor 34.

The process for depositing the film can be implemented using a computer program product that is executed by processor 34. The computer program code can be written in any conventional computer readable programming language, such as, 68000 assembly language, C, C++, Pascal, Java, Fortran, or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

Figure 3C:
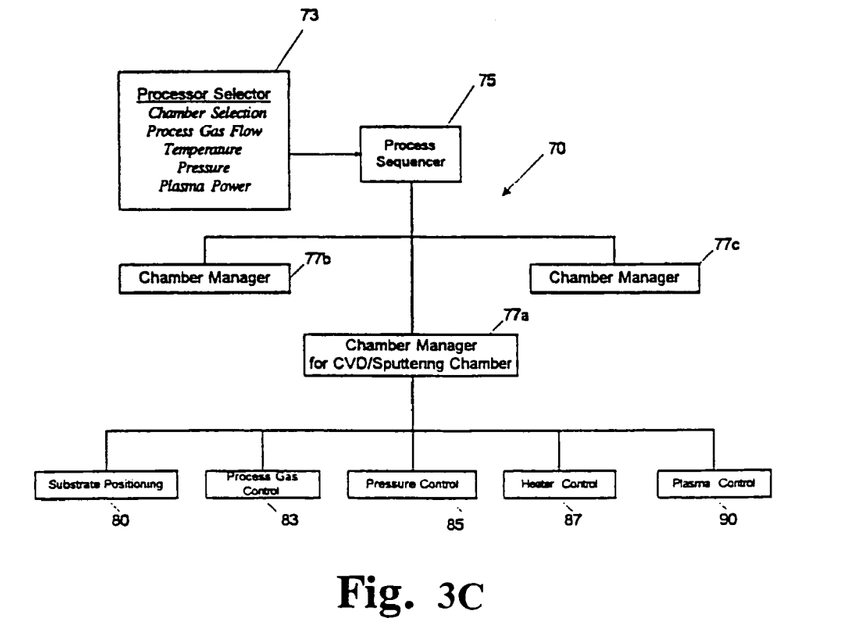
FIG. 3C shows a block diagram of an embodiment of a hierarchical control structure, including system control software used with the apparatus for plasma CVD.

FIG. 3C shows an illustrative block diagram of the hierarchical control structure of the system control software (e.g., computer program 70) according to embodiments of the apparatus. A user may enter a process set number and process chamber number into a process selector subroutine 73 in response to menus or screens displayed on the CRT monitor by using an interface (e.g., light pen 50b). The process sets are predetermined sets of process parameters necessary to carry out specified processes, and are identified by predefined set numbers. The process selector subroutine 73 may identify (i) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions (e.g., RF power levels, low frequency RF, etc.) cooling gas pressure, and chamber wall temperature, among others. They may be provided to the user in the form of a recipe. The parameters specified by the process recipe may be entered utilizing the light pen/monitor interface (50a–b).

Signals for monitoring the process are provided by the analog input and digital input boards of the system controller and the signals for controlling the process are output on the analog output and digital output boards of system 10.

A process sequencer subroutine 75 comprises program code that may accept the identified process chamber and set of process parameters from the process selector subroutine 73, and control operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 75 can be designed to take into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 causes execution of the process set by passing the particular process set parameters to a chamber manager subroutine 77a–c which controls multiple processing tasks in a process chamber 15 according to the process set determined by the sequencer subroutine 75. For example, the chamber manager subroutine 77a comprises program code for controlling sputtering and CVD process operations in the process chamber 15. The chamber manager subroutine 77 also controls execution of various chamber component subroutines which control operation of the chamber components necessary to carry out the selected process set. Examples of chamber component subroutines are substrate positioning subroutine 80, process gas control subroutine 83, pressure control subroutine 85, heater control subroutine 87, and plasma control subroutine 90. Those having ordinary skill in the art would readily recognize that other chamber control subroutines can be included depending on what processes are desired to be performed in the process chamber 15. In operation, the chamber manager subroutine 77a selectively schedules or calls the process component subroutines in accordance with the particular process set being executed. The chamber manager subroutine 77a schedules the process component subroutines similarly to how the sequencer subroutine 75 schedules which process chamber 15 and process set is to be executed next. Typically, the chamber manager subroutine 77a includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described with reference to FIG. 1C. The substrate positioning subroutine 80 comprises program code for controlling chamber components that are used to load the substrate onto the susceptor 12, and optionally to lift the substrate to a desired height in the chamber 15 to control the spacing between the substrate and the gas distribution manifold 11. When a substrate is loaded into the process chamber 15, the susceptor 12 is lowered to receive the substrate, and thereafter, the susceptor 12 is raised to the desired height in the chamber, to maintain the substrate at a first distance or spacing from the gas distribution manifold during the CVD process. In operation, the substrate positioning subroutine 80 controls movement of the susceptor in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines, and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates, and activating the safety shut-off valves when an unsafe condition is detected.

In some processes, an inert gas such as argon is flowed into the chamber 15 to stabilize the pressure in the chamber before reactive process gases are introduced into the chamber. For these processes, the process gas control subroutine 83 is programmed to include steps for flowing the inert gas into the chamber 15 for an amount of time necessary to stabilize the pressure in the chamber, and then the steps described above would be carried out. Additionally, when a process gas is to be vaporized from a liquid precursor, for example tetraethylorthosilane ("TEOS"), the process gas control subroutine 83 would be written to include steps for bubbling a delivery gas such as helium through the liquid precursor in a bubbler assembly or introducing a carrier gas such as helium to a liquid injection system. When a bubbler is used for this type of process, the process gas control subroutine 83 regulates the flow of the delivery gas, the pressure in the bubbler, and the bubbler temperature in order to obtain the desired process gas flow rates. As discussed above, the desired process gas flow rates are transferred to the process gas control subroutine 83 as process parameters. Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 85 comprises program code for controlling the pressure in the chamber 15 by regulating the size of the opening of the throttle valve in the exhaust system (not shown) of the chamber. The size of the opening of the throttle valve is set to control the chamber pressure to the desired level in relation to the total process gas flow, size of the process chamber, and pumping setpoint pressure for the exhaust system. When the pressure control subroutine 85 is invoked, the desired, or target, pressure level is received as a parameter from the chamber manager subroutine 77a. The pressure control subroutine 147 operates to measure the pressure in the chamber 15 by reading one or more conventional pressure manometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 85 can be written to open or close the throttle valve to a particular opening size to regulate the chamber 15 to the desired pressure.

The heater control subroutine 87 comprises program code for controlling the temperature of the lamp module that is used to heat the substrate 20. The heater control subroutine 87 is also invoked by the chamber manager subroutine 77a and receives a target, or setpoint, temperature parameter. The heater control subroutine 87 measures the temperature by measuring voltage output of a thermocouple located in a susceptor 12, compares the measured temperature to the setpoint temperature, and increases or decreases current applied to the lamp module 26 to obtain the setpoint temperature. The temperature is obtained from the measured voltage by looking up the corresponding temperature in a stored conversion table, or by calculating the temperature using a fourth order polynomial. When radiant lamps are used to heat the susceptor 12, the heater control subroutine 87 gradually controls a ramp up/down of current applied to the lamp. The gradual ramp up/down increases the life and reliability of the lamp. Additionally, a built-in fail-safe mode can be included to detect process safety compliance, and can shut down operation of the lamp module 26 if the process chamber 15 is not properly set up.

The plasma control subroutine 90 comprises program code for setting low and high frequency the RF power levels applied to the process electrodes in the chamber 15, and to set the low frequency RF frequency employed. Similar to the previously described chamber component subroutines, the plasma control subroutine 90 is invoked by the chamber manager subroutine 77a.

The above reactor description is mainly for illustrative purposes an variations in components such as susceptor design, heater design, RF power frequencies, location of RF power connections and others are possible. For example, the substrate could be supported and heated by a resistively heated platen. The methods of the present invention are not limited to a specific PECVD apparatus like the one shown.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, or groups.

What is claimed is:

1. A method of forming a sidewall spacer on a gate electrode of a metal oxide semiconductor device comprising:
    forming a first plasma to form an oxide layer on a side of the gate electrode, wherein the first plasma is generated from a oxide gas comprising $O_3$ and an amino silane; and
    forming a second plasma to form a carbon-doped nitride layer on the oxide layer, wherein the second plasma is generated from a nitride gas comprising $NH_3$ and an amino silane, wherein the first and second plasmas are formed using plasma CVD, wherein the amino silane flows uninterrupted between the forming of the first plasma and the forming of the second plasma.

2. The method of claim 1, wherein the amino silane is bis-(tertiarybutylamine)silane.

3. The method of claim 1, wherein the formation of the oxide layer and the nitride layer occurs at a temperature from about 250° C. to about 400° C.

4. The method of claim 3, wherein the high frequency RF power is about 100 W to about 300 W, and a low frequency RF power is about 0 W to about 200 W.

5. The method of claim 1, wherein, during the formation of the nitride layer, a first flow rate of the amino silane is about 200 mgm to about 600 mgm, and a second flow rate of the $NH_3$ is about 200 sccm to about 3000 sccm.

6. The method of claim 1, wherein the first and the second plasmas are formed using an RF power source comprising high frequency RF power.

7. The method of claim 6, wherein, during the formation of the nitride layer, a flow rate of the helium is about 1000 sccm to about 3000 sccm.

8. The method of claim 1, wherein the nitride gas comprises helium.

9. The method of claim 1, wherein a pressure for the nitride gas is about 2.5 torr to about 6 torr.

10. The method of claim 1, wherein the oxide layer has a thickness of about 50 Å.

11. The method of claim 1, wherein the nitride layer has a thickness of about 400 Å to about 1500 Å.

12. A method of forming a metal-oxide semiconductor device, the method comprising:
    forming a gate oxide and a gate electrode over a semiconductor substrate;
    forming a halo section in the substrate; and
    forming a first sidewall spacer along a first side of the gate electrode and over the halo section, and a second sidewall spacer along a second side of the gate electrode opposite the first side,
    wherein the first and the second sidewall spacers comprise an oxide layer contacting the gate electrode and a carbon-doped nitride layer contacting the oxide layer, and wherein both the oxide layer and the nitride layer are formed by way of plasma CVD using a silicon source comprising bis-(tertiarybutylamine)silane, wherein the bis-(tertiarybutylamine)silane flows uninterrupted between the formation of the oxide layer and the nitride layer.

13. The method of claim 12, wherein the first and the second sidewall layers are formed at a temperature from about 250° C. to about 400° C.

14. The method of claim 12, wherein the oxide layer is formed from a oxide gas comprising $O_3$ and the bis-(tertiarybutylamine)silane.

15. The method of claim 12, wherein the nitride layer is formed form a nitride gas comprising $NH_3$ and the bis-(tertiarybutylamine)silane.

16. The method of claim 12, wherein the forming of the halo section comprises implanting a dopant in the substrate at a dose of about $1 \times 10^{13}$ cm$^{-2}$ to about $5 \times 10^{15}$ cm$^{-2}$.

17. The method of claim 16, wherein the dopant comprises boron.

18. The method of claim 12, wherein the halo section has a dopant concentration of about $1 \times 10^{18}$ cm$^{-3}$ or more.

19. The method of claim 12, comprising, prior to forming the first and second sidewall spacer, annealing the halo section at a temperature from about 500° C. to about 800° C.

20. A method of forming a field effect transistor in a low thermal budget process, the method comprising:
    forming a gate electrode over a semiconductor substrate;
    forming a halo section comprising a boron dopant in the substrate; and
    forming a first sidewall spacer along a first side of the gate electrode and over the halo section, and a second sidewall spacer along a second side of the gate electrode opposite the first side,
    wherein the first and the second sidewall spacers comprise an oxide layer contacting the gate electrode and a carbon-doped nitride layer contacting the oxide layer, and wherein both the oxide layer and the nitride layer are formed by way of plasma CVD operating at a temperature from about 250° C. to about 400° C. and using a silicon source comprising bis-(tertiarybutylamine)silane, wherein the bis-(tertiarybutylamine)silane flows uninterrupted between the formation of the oxide layer and the nitride layer.

* * * * *